(12) United States Patent
Park (10) Patent No.: US 7,108,135 B2
(45) Date of Patent: Sep. 19, 2006

(54) WORKPIECE CONTAINER ASSEMBLY AND APPARATUS FOR OPENING/CLOSING THE SAME

(75) Inventor: Dong-Jin Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 704 days.

(21) Appl. No.: 10/282,196

(22) Filed: Oct. 29, 2002

(65) Prior Publication Data

US 2003/0141217 A1    Jul. 31, 2003

(30) Foreign Application Priority Data

Jan. 28, 2002  (KR) .................................. 2002-4900

(51) Int. Cl.
*B65D 85/00* (2006.01)
*B65D 85/90* (2006.01)

(52) U.S. Cl. ..................... 206/711; 220/326; 292/163

(58) Field of Classification Search ........ 206/710–712, 206/1.5; 220/315, 323, 326; 292/32, 42, 292/137, 162, 163, 175, 302, DIG. 11, DIG. 61, 292/DIG. 63
See application file for complete search history.

(56) References Cited

U.S. PATENT DOCUMENTS

| 608,601 | A | * | 8/1898 | Henneberg ................... 292/42 |
|---|---|---|---|---|
| 907,085 | A | * | 12/1908 | McNutt ....................... 292/42 |
| 2,535,275 | A | * | 12/1950 | Dixon .......................... 49/465 |
| 2,936,189 | A | * | 5/1960 | Pearson ...................... 292/42 |
| 3,666,338 | A | * | 5/1972 | Russell ....................... 312/215 |
| 4,923,079 | A | * | 5/1990 | Foy ............................... 220/7 |
| 5,967,571 | A | | 10/1999 | Gregerson |
| 6,021,603 | A | * | 2/2000 | Prete et al. ................... 49/183 |
| 6,186,331 | B1 | | 2/2001 | Kinpara et al. |
| 6,945,405 | B1 | * | 9/2005 | Bores et al. ................. 206/711 |
| 2004/0211701 | A1 | * | 10/2004 | Weaver ...................... 206/710 |

\* cited by examiner

*Primary Examiner*—Mickey Yu
*Assistant Examiner*—Jerrold Johnson
(74) *Attorney, Agent, or Firm*—Volentine Francos & Whitt, PLLC

(57) ABSTRACT

A workpiece container assembly includes a container, and a cover having a locking section that facilitates manipulation and gripping by an apparatus for opening and closing the workpiece container assembly. The container is configured to accommodate workpiece(s) therein. A body of the cover covers an open side of the container. The locking section of the cover includes a bar protruding towards the exterior of the body of the cover, a jaw extending from the bar, and a resilient member connected to the bar such that the bar is biased in its longitudinal direction. The container also includes a frame defining an insertion hole into which the bar of the locking section of the cover is inserted. The opening/closing apparatus includes a clamp that can latch onto the jaw and move the bar against the biasing force of the resilient member to withdraw the bar from the insertion hole in the frame of the container.

9 Claims, 8 Drawing Sheets

WORKPIECE CONTAINER ASSEMBLY AND APPARATUS FOR OPENING/CLOSING THE SAME

BACKGROUND OF THE INVENTION

1. Field of the Invention

The present invention relates to a workpiece container assembly and to an apparatus for opening/closing the container of the assembly. More particularly, the present invention relates to a container assembly for accommodating semiconductor wafers in the course of their being processed, and to an apparatus for opening and closing a cover of the container assembly.

2. Description of the Related Art

Semiconductor devices are fabricated by subjecting a wafer to various manufacturing processes, such as photolithography, deposition, etching, and thin film-forming processes. These wafers are typically 8 inches in diameter. The wafers are accommodated in a container and from there are introduced into the manufacturing apparatus in which the above-mentioned processes are carried out. As the technology behind these processes has improved, wafers having a diameter of 12 inches are being used in addition to the 8-inch wafers.

An open wafer cassette is mainly used to accommodate the wafers when the wafers have a diameter of 8 inches. Recently, however, a closed-type of container assembly, for example, a front open unified pod (hereinafter, simply referred to as a "FOUP") has been developed for use with the larger 12-inch wafers. The FOUP is better than an open wafer cassette in preventing the wafers from being contaminated when the wafers are transferred to and from the manufacturing apparatus.

The FOUP includes a container in which the wafers are accommodated, and a cover disposed over the front of the container. In addition, a separate opening/closing apparatus is used to remove the cover from the container. An example of such a FOUP is disclosed in U.S. Pat. No. 6,186,331 issued to Kinpara, et al.

Figure 1:
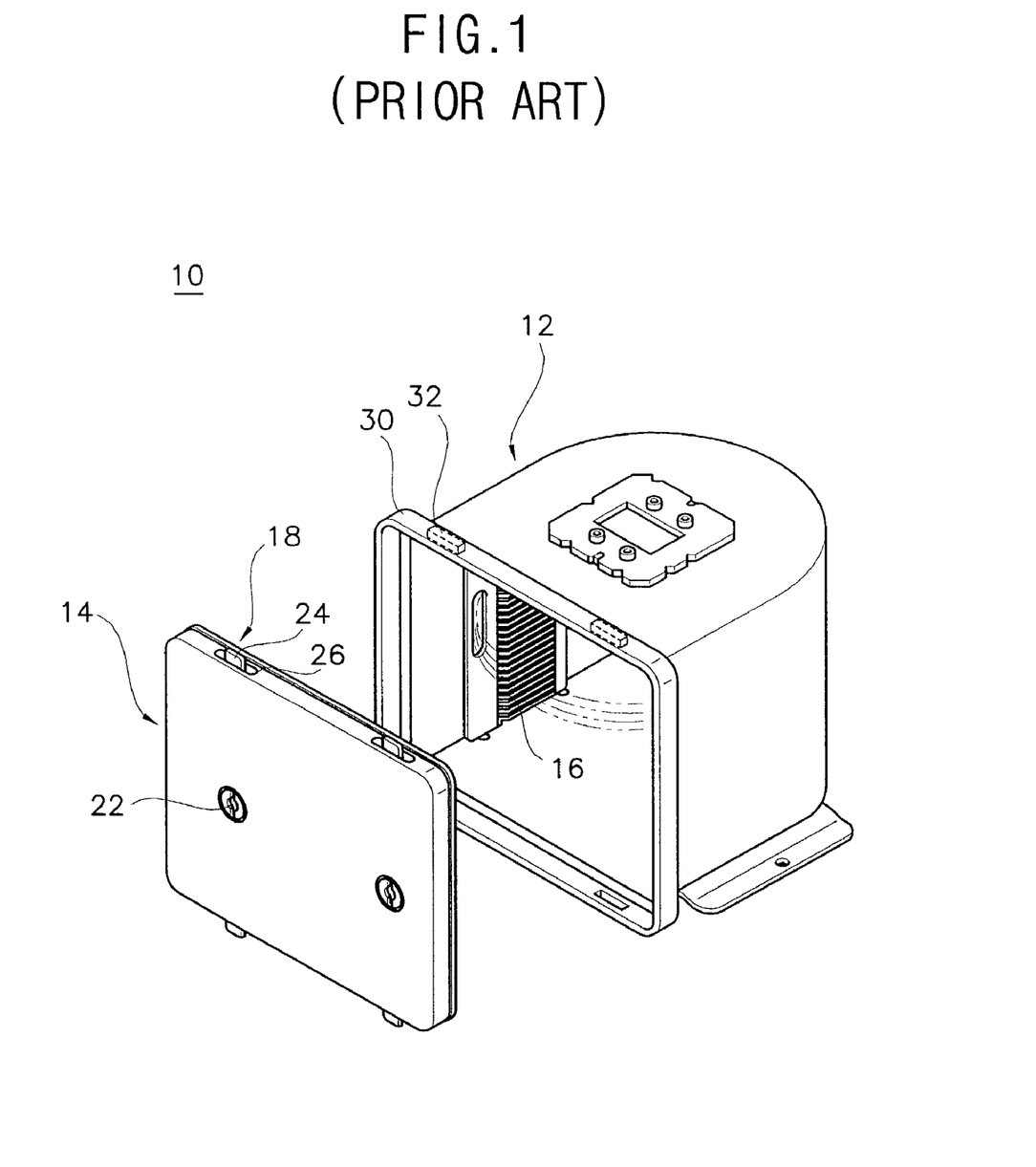
FIG. 1 is a perspective view of a conventional FOUP.

Hereinafter, a conventional FOUP and an apparatus for opening/closing the FOUP will be described with reference to FIGS. 1 and 2.

The FOUP 10 includes a container 12 for accommodating wafers therein, and a cover 14 covering an open side of the container 12 so as to close the container 12. The container 12 also has opposite sidewalls which define therein a series of parallel slots 16. The wafers W are inserted into the slots 16, respectively. On the other hand, the cover 14 includes a main cover body, and a locking section 18. The container 12 has a frame 30 which cooperates with the locking section 18 so that the cover 14 may be attached to and detached from the container 12.

Figure 2:
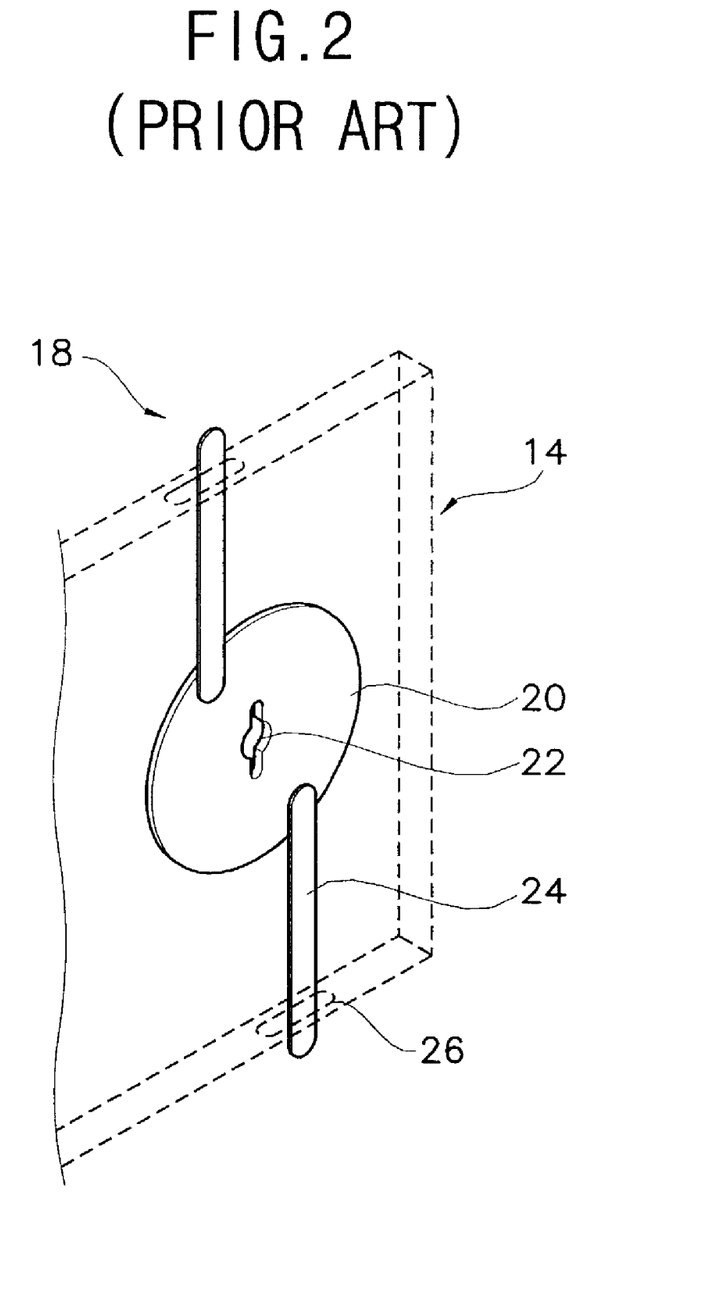
FIG. 2 is a perspective view of part of a locking section of the conventional FOUP.

Referring to FIG. 2, the locking section 18 includes a plate 20 that is rotatably supported within the body of the cover 14. The rotatable plate 20 has a keyhole 22 in the center thereof. The keyhole 22 is exposed at the front of the cover 14 such that a key can be inserted into the keyhole 22 from outside of the cover 14. When a user rotates the key after inserting the key into the keyhole 22, the plate 20 is rotated.

The locking section 18 of the cover 14 also includes a pair of bars 24. First ends of the bars 24 are connected to the rotatable plate 20, and second ends of the bars 24 protrude from the body of the cover 14 through upper and lower surfaces of the cover 14, respectively. A respective inlet hole 26 extends through each of the upper and lower surfaces of the cover 14 to allow the bars 24 to protrude from the cover 14.

The frame 30 is integral with the container 12 and has insertion holes 32 (shown in FIG. 1) which are positioned across from inlet holes 26 of the cover 14 so as to receive the bars 24 of the cover 14 when the cover 14 is attached to the container 12. That is, the bars 24 of the locking section 18 are inserted into the insertion holes 32 formed in the frame 30 so that the cover 14 is coupled to the container 12, thereby closing the FOUP 10.

The FOUP 10 having the above structure requires a separate opening/closing apparatus for operating the cover 14 to open/close the container 12.

Generally, the opening/closing apparatus includes a loading section which supports the FOUP 10 and is operable to move the FOUP 10 horizontally, a plate that will face the cover of a FOUP 10 supported by the loading section, a key mounted on a side of the plate so as to be insertable into the keyhole 22 of the FOUP, and a drive mechanism for moving the plate vertically or horizontally. One example of such a FOUP opening/closing apparatus is disclosed in U.S. Pat. No. 6,053,688 (issued to Cheng).

Next, the operation of the FOUP opening/closing apparatus will be described.

First, a closed FOUP 10 accommodating a plurality of wafers to be processed is placed on the loading section. Then, the FOUP 10 is moved horizontally towards the plate until the plate and the cover 14 engage each other. At this time, the key mounted on the plate is inserted into the keyhole 22 in the front of the cover 14.

Subsequently, the key is rotated. As a result, the plate 20 is rotated and the bars 24 connected to the rotating plate 20 are moved vertically so that second ends of the bars 24 are withdrawn into the cover 14. Accordingly, the cover 14 can be separated from the container 12. In addition, since the key is inserted into the keyhole 22, the cover 14 is attached to the plate.

Then, the plate to which the cover 14 is attached is moved horizontally to detach the cover 14 from the container. The plate is then moved vertically so as to open the FOUP 10.

However, the keyhole 22 formed in the cover of the conventional FOUP 10 is very small and thus, the key of the opening/closing apparatus is also very small. Accordingly, the key cannot be precisely aligned with the keyhole 22 when the cover 14 of the FOUP 10 is to be separated from the container 12. Therefore, sometimes the FOUP 10 is not be opened.

In addition, the FOUP 10 is frequently opened/closed during the semiconductor manufacturing process and hence, the key is frequently inserted into the keyhole 22 and is rotated while in the keyhole 22. For this reason, the keyhole 22 becomes enlarged, and eventually a gap is formed between the key and the keyhole 22. If a large gap is formed between the key and the keyhole 22, the opening/closing apparatus may not be able to rotate the key within the keyhole 22. In this case, an opening/closing error of the FOUP 10 occurs. As a result, the processing time is increased and the productivity of the semiconductor manufacturing process is correspondingly decreased.

SUMMARY OF THE INVENTION

An object of the present invention is to obviate the problems of the prior art. Therefore, it is a first object of the present invention to provide a workpiece container assembly whose cover has a locking section that facilitates the opening/closing of the cover. A second object of the present invention is to provide an apparatus for opening/closing the workpiece container assembly.

A still further object of the present invention is to provide a workpiece container assembly whose cover has a locking section, in combination with an apparatus having a cover-separating section that can simultaneously manipulate the locking section of the cover and grip the cover to open/close the workpiece container assembly.

The workpiece container assembly may be a FOUP configured to accommodate 12-inch semiconductor wafers.

The container assembly includes a container for accommodating workpiece(s) therein, and a cover for covering the container. The container has an opening at one side thereof, and a frame delimiting the opening and having an insertion hole therein. The cover has a cover body that spans the opening of the container, and a locking section that includes a bar protruding towards an exterior of the body of the cover and a resilient member connected to the bar such that the bar is biased longitudinally into the insertion hole in the frame of the container.

A jaw extends from the bar to the exterior of the body of the cover. The jaw is preferably tapered so as to define a notch therein.

The apparatus for opening/closing the container assembly includes a loading section having a stage dedicated to support the container assembly, and a plate assembly extending upright relative to the stage and positionable in opposition to the cover of a container assembly disposed on the stage of the loading section, the plate assembly having a cover-separating section including a clamp for unlocking the cover from the container and gripping the unlocked cover.

The clamp is operated to engage the jaw extending from the bar of the locking section and move the bar against the biasing force of the resilient member to withdraw the bar from the insertion hole in the frame of the container. The clamp also latches onto the jaw, using the notch in the jaw, so that the cover can be removed form the opening of the container once the locking section has been unlocked.

The locking section of the workpiece container assembly can be manipulated using the simple operation of a clamp. In this way, there is a wide margin for positioning of the cover-separating section of the opening/closing apparatus relative to the cover of the container assembly, and the manipulation of the locking section by the cover-separating section hardly causes the locking section to wear in such a manner that it becomes difficult to open and close the cover. Accordingly, few processing errors ever arise as the result of the continued us of the container assembly and opening/closing apparatus of the present invention.

BRIEF DESCRIPTION OF THE DRAWINGS

The above and other objects, features and advantages of the present invention will become more apparent from the following detailed description of the preferred embodiments thereof made with reference to the attached drawings, of which.

DETAILED DESCRIPTION OF THE PREFERRED EMBODIMENTS

A FOUP 100 according to the present invention will now be described in detail with reference to FIGS. 3–5B.

Figure 3:
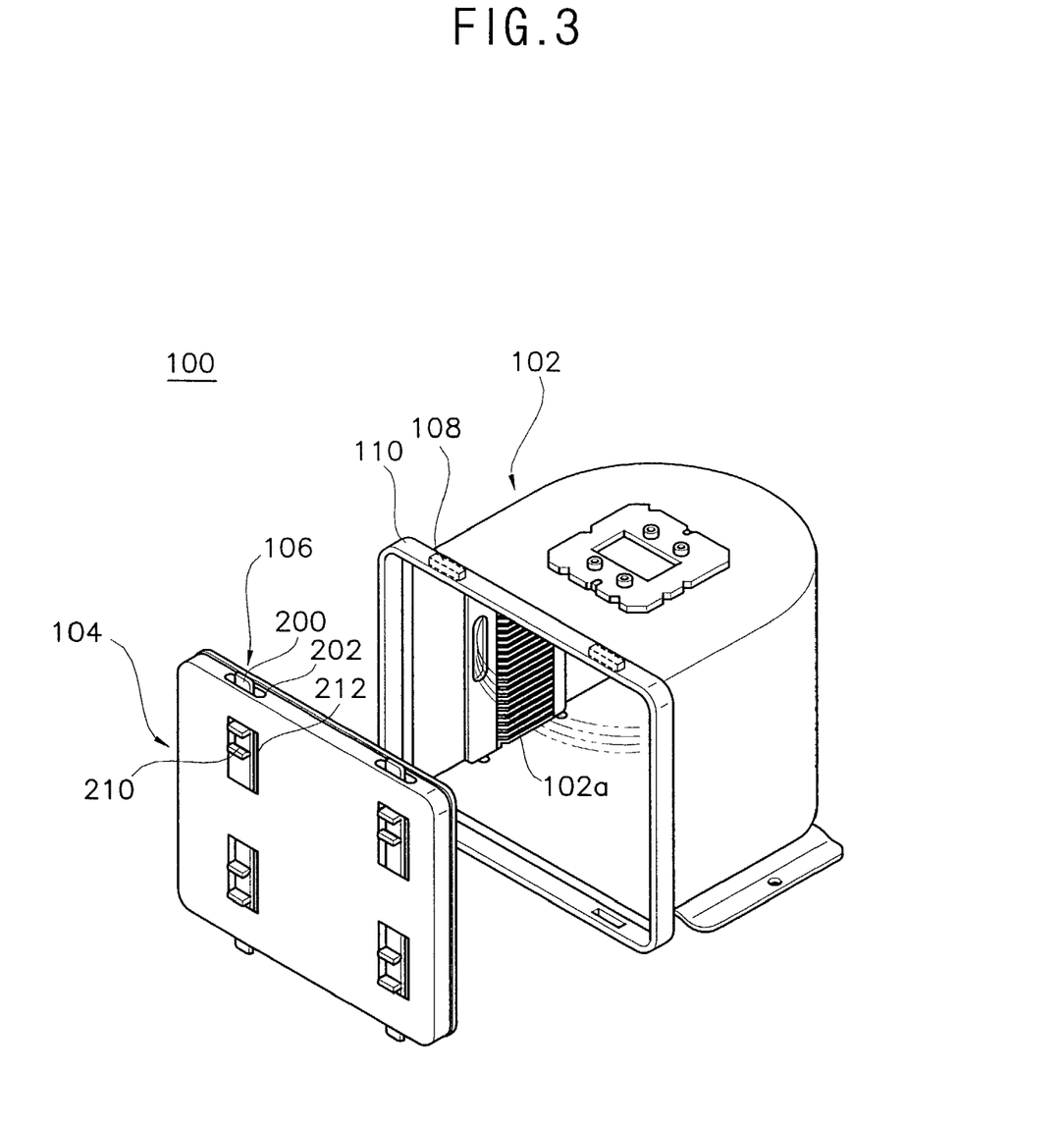
FIG. 3 is a perspective view of a FOUP according to the present invention.

Referring first to FIG. 3, the FOUP 100 includes a container 102 having an opening at one side thereof, and a cover 104 disposed over the opening for closing the container 102. The open side of the container 102 will be referred to hereinafter as the front of the container 102.

The container 102 is configured to accommodate a plurality of wafers therein. More specifically, the container 102 has opposite sidewalls in which a series of parallel slits 102a are defined. The wafers are received in the slits 102a, respectively.

The cover 104 has a cover body that spans the opening at the front of the container 102, and at least one locking section 106 (refer to FIG. 4) for securing the cover 104 to the container 102. The locking section 106 includes a bar 200 protruding from the body of the cover 104, and a resilient member 204 connected to the bar 200. In addition, the container 102 has a frame 110 extending around and thus delimiting the opening at the front of the container 102. The frame 110 also defines an insertion hole 108 into which the bar 200 is inserted.

Figure 4:
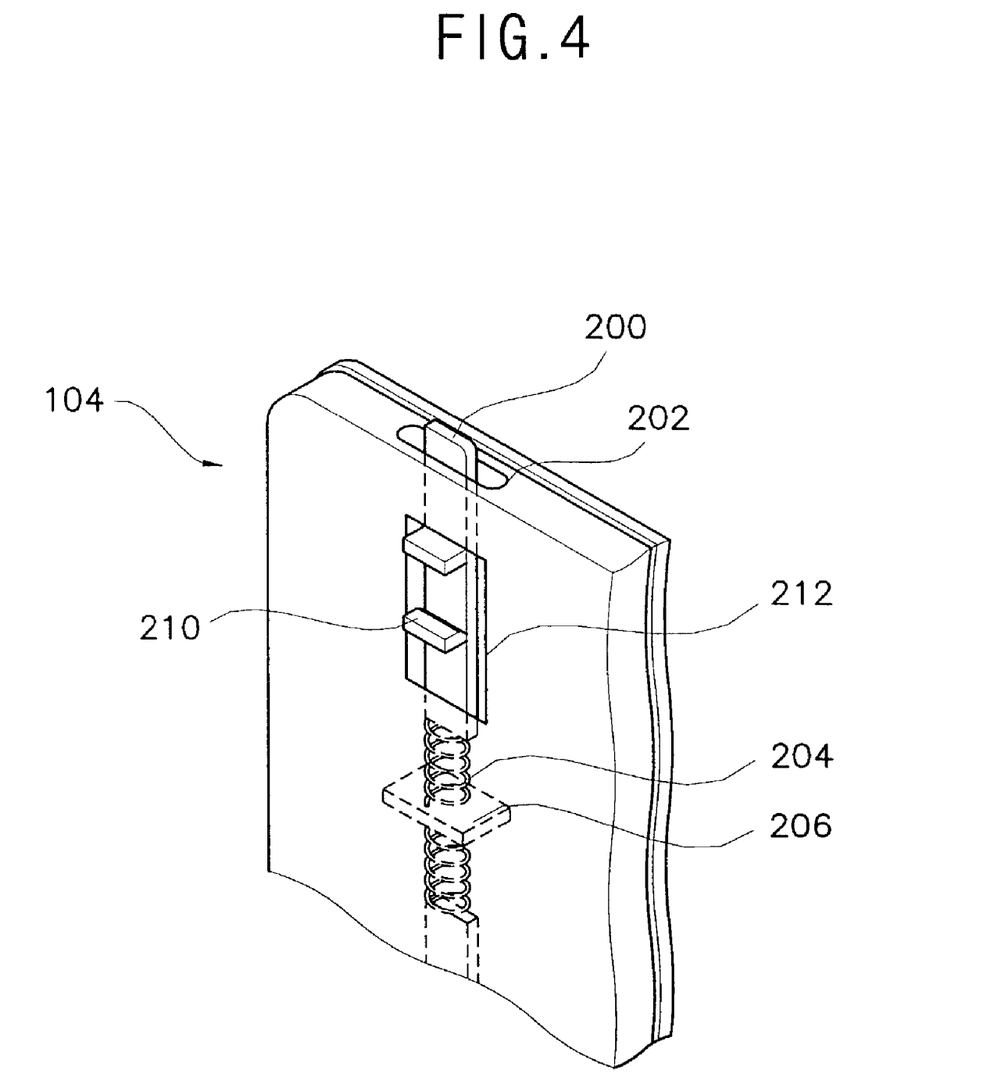
FIG. 4 is a perspective view of a locking section of the FOUP according to the present invention.

The bar 200 is biased into the insertion hole 108 by the resilient member 204 of the locking section 106 to keep the cover 104 secured to the container. On the other hand, the cover 104 may be separated from the container 102 by withdrawing the bar 200 from the insertion hole 108 against the force exerted by the resilient member 204.

The locking section 106 and the frame 110 will be described in more detail below.

Referring still to FIGS. 3 and 4, a resilient member 204 is connected to the second end of the bar 200. The resilient member 204 extends in the longitudinal direction of the bar 200. Thus, when a longitudinal force is applied to the bar 200 to compress the resilient member 204, the first end of the bar 200 is retracted into the body of the cover 104.

The cover 104 also includes a supporting member 206 connected to one end of the resilient member 204 for supporting the resilient member 204. The supporting member 206 extends within the body of the cover 104 in a direction perpendicular to the direction in which the bar 200 is free to move. Accordingly, the supporting member 206 allows the resilient member 204 to be compressed when an external force is applied to the bar 200.

When the cover 104 is fitted into the opening at the front of the container 102, the insertion hole 108 in the frame 110 of the container 102 confronts the inlet hole 202 in the body of the cover 104, respectively. Accordingly, the first end of the bar 200 extending from the body of the cover 104 will be inserted into the insertion hole 108 of the frame 110, whereby the cover 104 is locked to the container 102.

In addition, the front of the body of the cover 104 has a hole 212 therethrough that exposes a portion of the bar 200. The locking section 106 further includes a jaw 210 extending horizontally from the bar 200 through the hole 212. Thus, an external force can be securely applied to an upper or lower surface of the jaw 210 in the longitudinal direction of the bar 200. Such an external force is transferred to the bar 200, whereby the resilient member 204 connected to the bar 200 can be compressed, the bar 200 is retracted, and the cover 104 is released from the container. That is, the first end of the bar 200 is withdrawn from the insertion hole 108, so the cover 104 can be separated from the container 102.

To facilitate this operation, the length of the hole 212, as taken in the longitudinal direction of the bar 200, is larger than the distance that the first end of the bar 200 protrudes into the insertion hole 108 in the frame 110 of the container 102. Preferably, the length of the hole 212, as taken in the longitudinal direction of the bar 200, is larger than the distance that the first end of the bar 200 protrudes form the inlet hole 202. Accordingly, the first end of the bar 200 can be retracted into the body of the cover 104 to release the cover 104 from the container 102.

In addition, the jaw 210 is tapered towards the bar 200 such that the cross-sectional area of that portion of the jaw 210 adjacent the bar 200 is smaller than the cross-sectional area of a distal end portion of the jaw 210.

Still further, the locking section 106 may include a second protrusion extending from the bar 200 and through the hole 212 in the body of the cover 104, adjacent and opposite to the jaw 210. As shown in the drawings, the protrusion may serve as a stop for the bar 200 by abutting an edge of the body of the cover 104 that defines an end of the hole 212 in the longitudinal direction (direction of movement) of the bar 200. The second protrusion may thus serve to position the jaw 210 relative to a clamp of the opening/closing apparatus (described later).

The cover 104 may also have more than one locking section 106. For instance, the cover 104 may have locking sections 106 that are longitudinally aligned. In this case, the bars 200 of the locking sections 106 extend in opposite directions, i.e., from the interior of the cover 104 to upper and lower surfaces of the cover 104, respectively. In addition, the cover 104 may have locking sections 106 that are disposed in parallel. In this case, the bars 200 of the locking sections 106 are laterally spaced from and extend parallel to one another. In either case, the frame 110 of the container has a plurality of insertion holes 108 that receive the bars 200 of the locking sections 106, respectively.

As shown best in FIG. 3, the present embodiment employs four locking sections 106. The two bars 200 of a first pair of the locking sections 106 extend towards the upper surface of the cover 104 and the two bars 200 of the other pair of locking sections 106 extend towards the lower surface of the cover 104. The frame 110 of the container 102 thus has four insertion holes 108 that receive the bars 200, respectively, so that the cover 104 can be secured stably on the container 102.

Figure 5A:
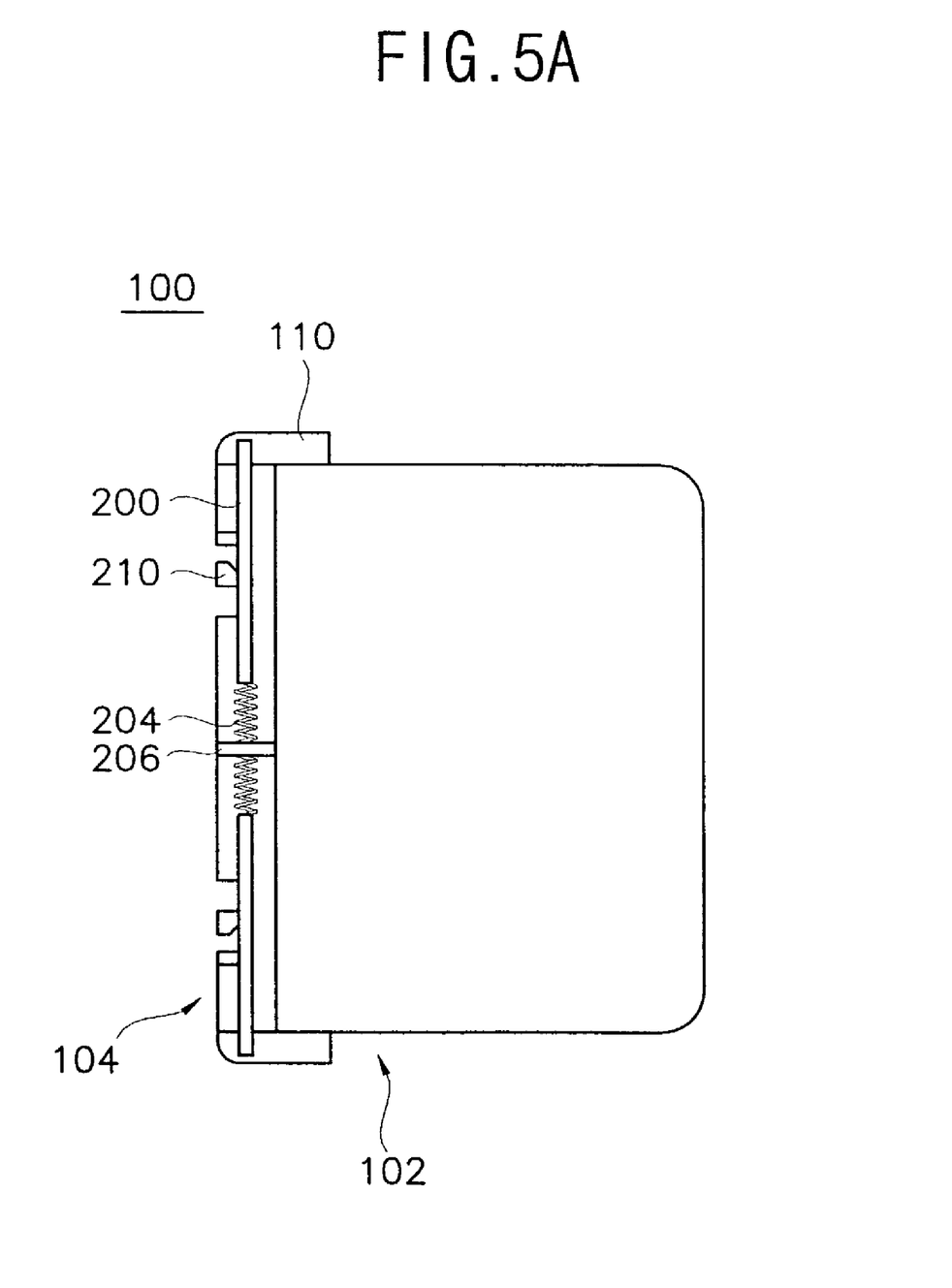
FIGS. 5A and 5B are sectional views of the FOUP according to the present invention.

That is, as shown in FIG. 5A, respective bars 200 of locking sections 106 of the FOUP 100 protrude through upper and lower surfaces of the body of the cover 104, respectively. Accordingly, one end of each bar 200 is received in an insertion hole 108, so that the FOUP 100 is closed.

Figure 5B:
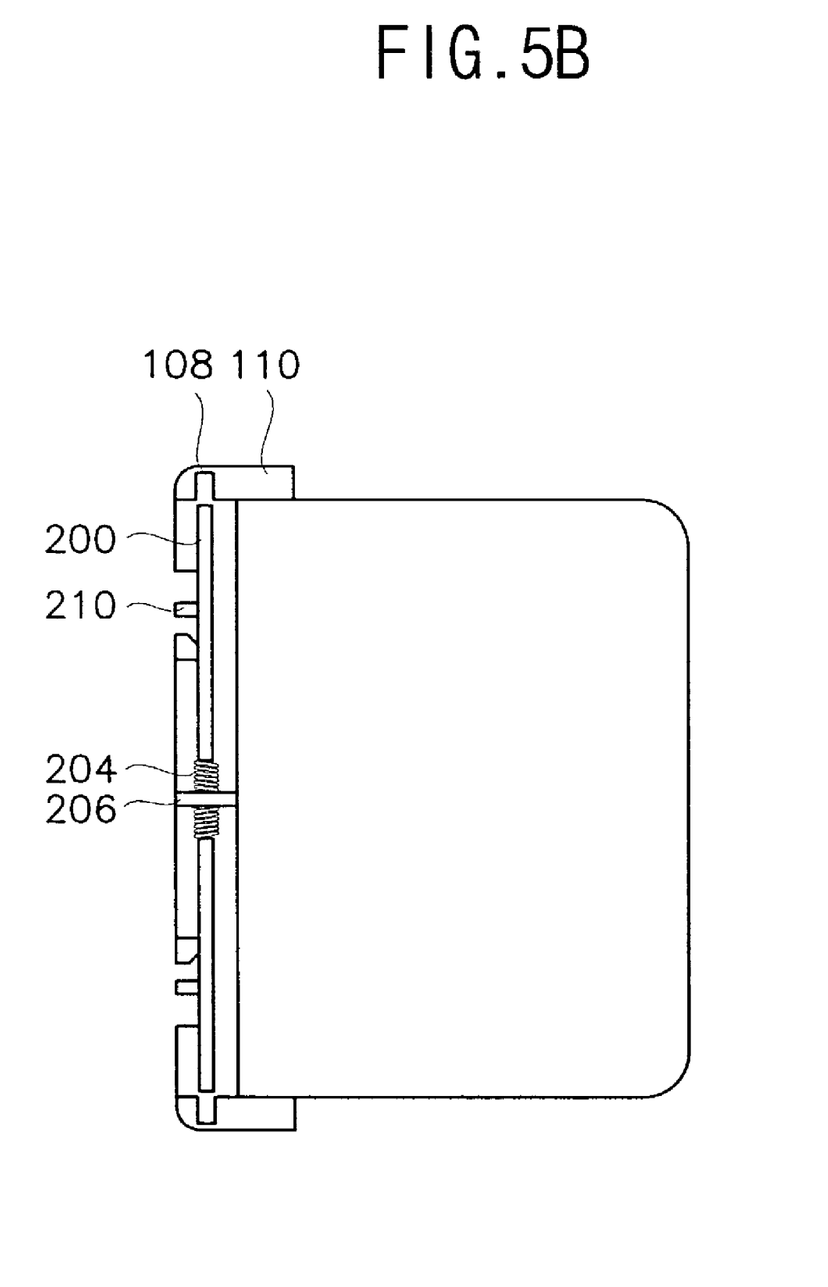

On the other hand, referring to FIG. 5B, the bars 200 of the locking sections 106 of the FOUP 100 may be withdrawn into the body of the cover 104 through the upper and lower surfaces of the body of the cover 104. That is, the bars 200 may be withdrawn from the insertion holes 108. In this case, the cover 104 can be separated from the container 102 so that the FOUP 100 can be opened.

Figure 6A:
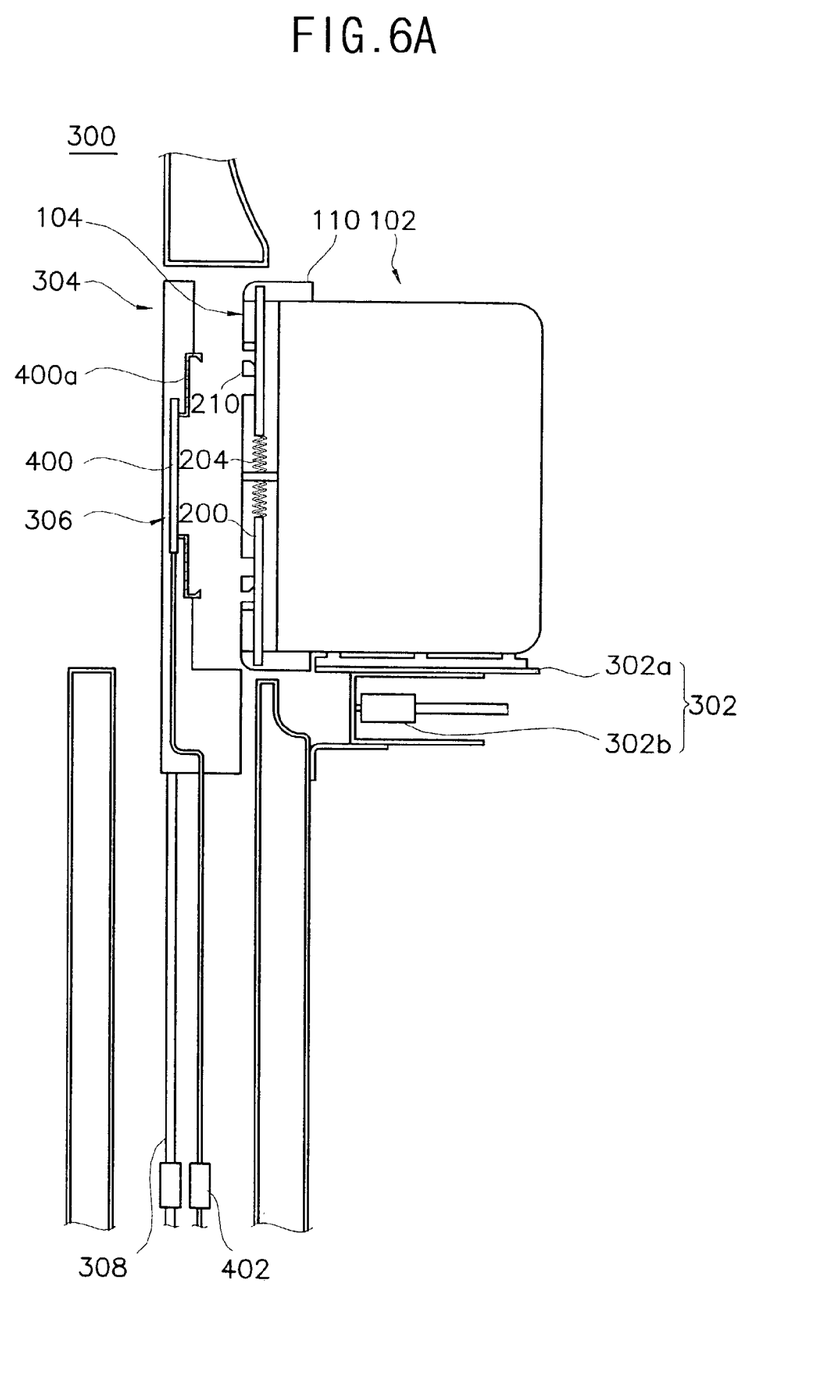
FIGS. 6A and 6B are sectional views of an apparatus for opening/closing a FOUP according to the present invention.
Figure 6B:
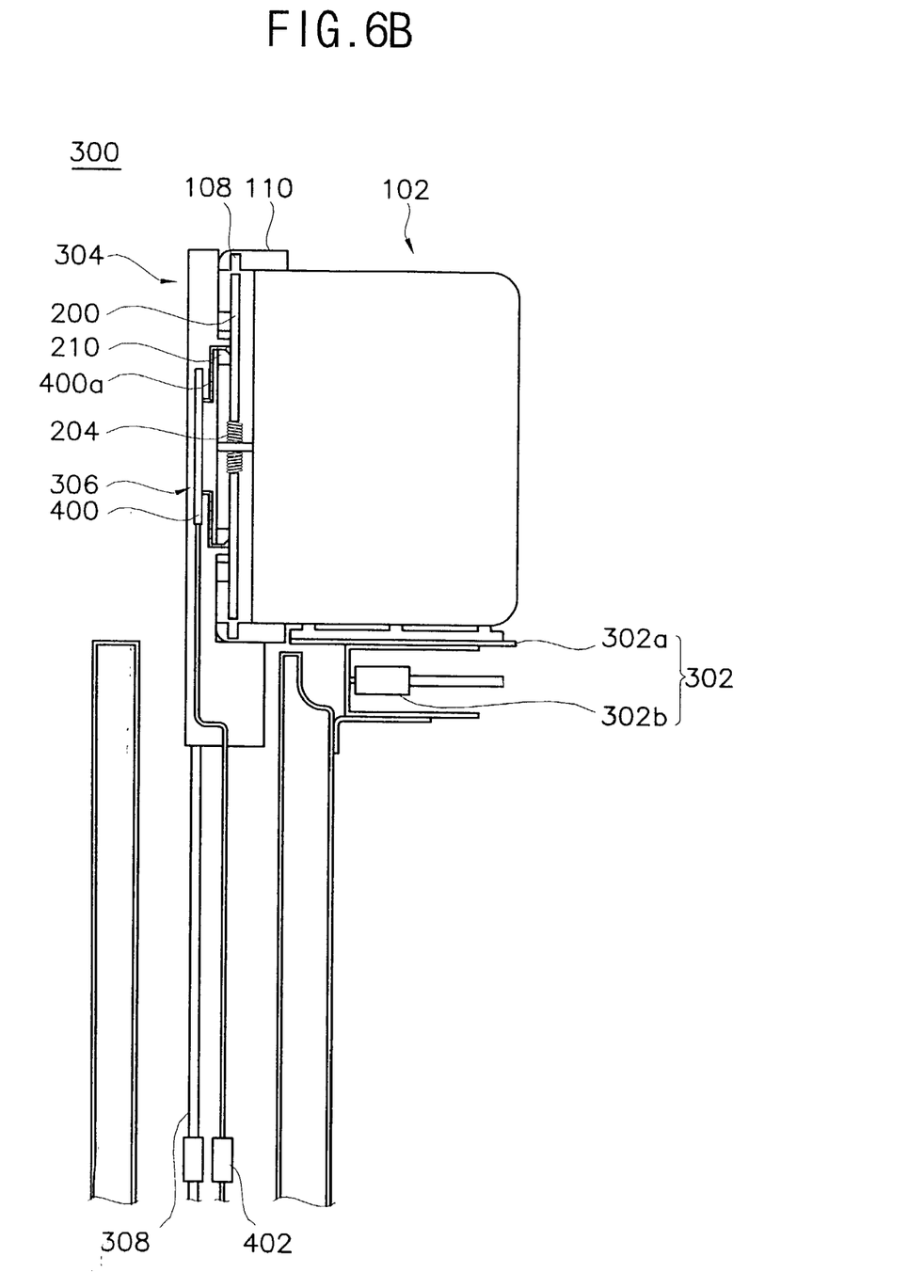

FIGS. 6A and 6B show an apparatus for opening/closing the FOUP according to the present invention. FIG. 6A shows a state in which the cover 104 is coupled to the container 102, and FIG. 6B shows a state in which the cover 104 has been separated from the container 102 by the apparatus.

In general, the FOUP opening/closing apparatus is disposed at a boundary between semiconductor processing equipment requiring a highly pure environment and a high vacuum state, and a semiconductor line in which such conditions are maintained at a much lower level. As soon as the cover of the FOUP is opened by the FOUP opening/closing apparatus, the container of the FOUP is mounted on the semiconductor processing equipment. Accordingly, the wafers accommodated in the FOUP are not exposed to the environment present in the semiconductor line while the semiconductor manufacturing process is being carried out by the semiconductor processing equipment.

Referring to FIGS. 6A and 6B, the FOUP opening/closing apparatus 300 has a loading section 302 onto which the FOUP 100 is loaded. In more detail, the loading section 302 includes a stage 302a for supporting the FOUP 100 thereon and a driving mechanism 302b for moving the stage 302a horizontally. In particular, the driving mechanism 302b moves the stage 302a horizontally towards a door of the semiconductor processing equipment. At this time, the cover 104 of the FOUP faces the door of the semiconductor processing equipment.

The FOUP opening/closing apparatus 300 also includes a plate assembly 304 and a drive mechanism 308 for moving the plate assembly 304 to a position confronting the cover 104 of a FOUP 100 that has been placed on the loading section 302. That is, the plate assembly 304 is positioned adjacent and upright relative to the stage 302a of the loading section. The plate assembly 304 is also located adjacent and opposite the door of the semiconductor processing equipment.

The plate assembly 304 has a cover-separating section 306 for physically detaching the cover 104 from the container 102 of the FOUP 100. To this end, the cover-separating section 306 is disposed at one side of the plate assembly 304 opposite to the cover 104 of the FOUP 100. The cover-separating section 306 comprises a clamp 400 that applies force to the bar 200 in a longitudinal direction of the bar 200 to thereby detach the cover 104 from the container 102 of the FOUP 100. In the present embodiment, the clamp 400 of the cover-separating section 306 simultaneously applies longitudinal forces to the bars 200 of all of the locking sections 106 of the cover 104. More specifically, the clamp 400 operates to move the first ends of bars 200 into the body of the cover 104, so the cover 104 can be separated from the container 102 of the FOUP 100. To this end, the number of arms 400a of the clamp 400 corresponds to the number of bars 200 of the FOUP 100.

In addition, the clamp 400 grips the cover 104 after it has been detached from the container 102 so that the freed cover 104 is basically attached to the cover-separating section 306. To this end, the clamp 400 is configured to grip the protruding jaw or jaws 210 that extend from the bar(s) 200 of the cover 104. In addition, the opening/closing apparatus 300 has a driving mechanism 402 connected to the arms 400a of the clamp. The driving mechanism 402 is operable to move the arms 400a toward and away from each. Like any of the driving mechanisms of the present invention, the driving mechanism 402 may comprises a motor and transmission elements for converting a rotary output of the motor to linear motion. The form of the clamp 400 of the cover-separating section 306 depends on the number and shape of the jaws 210 of the FOUP 100. Hereinafter, the clamp 400 will be described in more detail with reference to the embodiment of the FOUP described above in accordance with the present invention.

That is, as was described above, the FOUP 100 includes two pairs of locking sections 106, wherein each pair includes longitudinally aligned bars 200 that extend in opposite directions towards upper and lower surfaces of the body of the cover 104. Two protrusions, including one jaw 210, extend from each bar 200 as spaced from one other along the length of the bar 200. The jaw 210 is tapered towards the bar 200 so as to define a notch that will receive the distal end of an arm 400a of the clamp 400. That is, the distal end of each arm 400a has a shape corresponding to the notch in a respective one of the jaws 210, whereby the arms 400a mesh with the jaws 210.

The arms 400a of the clamp 400 are thus latched over the jaws 210 protruding from the bars 200 that extend towards the upper and lower surfaces of the body of the cover 104, respectively. In particular, each arm 400a of the clamp 400 is inserted into a space formed between a jaw 210 and the corresponding protrusion extending from the bar 200 which together allow the bar 200 to be stably moved by the clamp 400. Then, the driving mechanism 402 moves the arms 400a toward each other, whereby the bars 200 are withdrawn from the insertion holes 108 in the container 102, and into the body of the cover 104.

The driving mechanism 308 is operable to move the plate assembly 304 in both the vertical and horizontal directions, to thereby align the cover-separating section 306 with the locking section 106 of the cover 104. Therefore, once the cover 104 is gripped by the clamp 400 of the cover-separating section 306, the plate assembly 304 is moved horizontally and then vertically to remove the cover 104 from the open side of the container 102. Accordingly, the interior of the container 102 of the FOUP 100 is open to the door of the semiconductor processing equipment.

Note, however, the opening/closing operation can be performed even when the clamp 400 is not precisely aligned with the jaws 210 by the driving mechanism 308. In this case, the location of the arms 400a of the clamp 400 are merely adjusted relative to each other. That is, a precise positioning of the cover-separating section 306 relative to the container assembly 100 is not required before the cover 104 can be removed form the container 102.

As described above, the bar is biased by the resilient member and can be moved without the use a key and a key hole when detaching the cover from the container. Accordingly, the present invention provides for a wide margin for aligning the locking section of the cover with the cover-separating section of the apparatus for opening/closing the container assembly. In addition, any wearing of the engaged parts of the locking section and cover-separating section will not affect the ability of the operation to be easily carried out. Thus, the opening/closing operation will not cause a reduction in the productivity of the semiconductor device manufacturing process.

Although the present invention has been described in detail with reference to the preferred embodiments thereof, various changes, substitutions and alterations of these preferred embodiments will become apparent to those of ordinary skill in the art. All such changes, substitutions and alterations can be made to the disclosed embodiments without departing from the true spirit and scope of the invention as defined by the appended claims.

What is claimed is:

1. A container assembly for housing at least one workpiece, said assembly comprising:
    a container configured to accommodate at least one workpiece therein, said container having an opening at one side thereof, and said container including a frame delimiting at least a portion of the opening, said frame defining at least one insertion hole therein; and
    a cover covering the opening of the container, said cover including a cover body that spans said opening, and at least one locking section by which the cover is secured to the container, said cover body having an inner wall that faces said container, an outer wall opposite said inner wall, and at least one opening in said outer wall, and said locking section including a bar extending longitudinally towards the outside of the body of the cover and into the insertion hole in the frame of said container, a resilient member connected to the bar such that the bar is biased in a longitudinal direction thereof by said resilient member, a jaw extending from said bar into said opening in the outer wall of the body of the cover, and a protrusion extending from said bar into said opening in the outer wall of the body of the cover, the jaw and the protrusion being attached to and extending from the bar independently of each other the protrusion being spaced from the jaw along the bar in the longitudinal direction in which the bar is biased by the resilient member, and the protrusion abutting an edge of the body of the cover that defines an end of the hole in the longitudinal direction, whereby the protrusion serves as a stop that positions the jaw.

2. The container assembly as claimed in claim 1, wherein said resilient member biases said bar of said locking section to a position at which a first end of the bar protrudes from one of an upper and a lower surface of the body of said cover.

3. The container assembly as claimed in claim 2, wherein said resilient member is connected to a second end of the bar, which is disposed opposite to the first end of the bar, and is disposed in an axial alignment with the longitudinal direction of the bar.

4. The container assembly as claimed in claim 1, wherein the opening in the outer wall of the body of said cover has a length, in the longitudinal direction of said bar, that is greater than the distance by which said first end if the bar protrudes from the body of said cover.

5. The container assembly as claimed in claim 1, wherein the shape of the cross section of said jaw, as taken in a plane parallel to the longitudinal direction in which the bar is biased by the resilient member, tapers between opposite sides thereof only in a direction towards the protrusion.

6. The container assembly as claimed in claim 1, wherein the locking section further includes a supporting member disposed within the body of said cover and extending perpendicularly to said bar, said resilient member being supported by said supporting member.

7. The container assembly as claimed in claim 1, wherein said at least one locking section comprises at least one pair of locking sections, the bars of each said pair being axially aligned within the body of said cover.

8. The container assembly as claimed in claim 1, wherein said at least one locking section comprises at least one pair of locking sections, the bars of said locking sections extending parallel to and spaced laterally from one another within the body of said cover.

9. The container assembly as claimed in claim 1, wherein said container has inner side walls defining a plurality of parallel slits, whereby semiconductor wafers can be accommodated in said slits.

* * * * *